United States Patent [19]

Deacon

[11] Patent Number: 5,167,518
[45] Date of Patent: Dec. 1, 1992

[54] ELECTRICAL CIRCUIT DISCONNECT/TEST CONNECTOR

[76] Inventor: William H. Deacon, 13 School St., Kingston, Mass. 02364

[21] Appl. No.: 780,068

[22] Filed: Oct. 21, 1991

[51] Int. Cl.$^5$ ............................................. H01R 13/00
[52] U.S. Cl. .................................... 439/188; 439/693
[58] Field of Search ............... 439/188, 296, 345, 350, 439/353, 354, 693, 181, 186

[56] References Cited

U.S. PATENT DOCUMENTS

| | | | |
|---|---|---|---|
| 2,537,370 | 1/1951 | Parnes | 439/693 |
| 4,152,041 | 5/1979 | Hollyday et al. | 439/188 |

Primary Examiner—Joseph H. McGlynn
Attorney, Agent, or Firm—John P. McGonagle

[57] ABSTRACT

An electrical circuit disconnect/test connector with male and female plug portions inserted into a single circuit conductor having a male designated portion and a female designated portion. The male and female plug portions each have a central opening, two ends and an external locking barrel. Each plug portion has a test inserts with a hollow, cylindrical test connector element encapsulated therein. A cylindrical male crimp connector is concentrically and snugly positioned within the male plug portion test connector element, said connector having a crimp end portion and a connection end portion, said connection end portion being longitudinally divided into a forsward element and a rearward element longitudinally next to said crimp portion, said forward element having an electrically insulating sleeve thereon. A cylindrical female crimp connector concentrically and snugly positioned within the female plug portion test connector element, said connector having a crimp end portion and a connection end portion, said connection end portion being hollow and having an inwardly formed flange at its foremost end, said flange engaging the male crimp connector forward insulated element. Wherein joining said female and male plug external locking barrels moves said female crimp connector inwardly formed flange into engagement with the male crimp connector rearward element.

20 Claims, 4 Drawing Sheets

ELECTRICAL CIRCUIT DISCONNECT/TEST CONNECTOR

BACKGROUND OF THE INVENTION

This invention relates to devices to test electric circuits, and in particular to devices to test electric circuits while in operation.

There are many closed loop electrical circuits in power plant and industrial applications for which qualification, test and check-out procedures are highly desirable and, in case of failure, actually necessary. The troubleshooting of electrical circuits can be greatly simplified and expedited if they can be monitored while in operation. Moreover, in many applications, electrical equipment to be tested is difficult to access without disturbing electrical connections, e.g., terminal strips, equipment connections and the like. Disconnecting such equipment for test or check purposes interrupts a closed loop circuit and thus disrupts unit operation. Ideally, all units should be tested under dynamic rather than static conditions, and this is not usually possible with conventional trouble-shooting methods and equipment, which require lengthy, indirect and expensive routines.

SUMMARY OF THE INVENTION

In view of the foregoing disadvantages inherent in the known types of devices now present in the prior art, the present invention provides an improved electrical circuit disconnect/test connector. As such, the general purpose of the present invention, which will be described subsequently in greater detail, is to provide a new and improved electrical circuit disconnect/test connector which allows connection and disconnection of wires individually, i.e., without physical separation of wiring, and provides test connections for line/load monitoring. The invention allows for electrical trouble shooting measurements without requiring depowering of circuitry.

The present invention eliminates the need for disturbing electrical connections thus avoiding retorqueing of terminal screws, dropped screws, stripped screws/terminations and rewiring errors. The present invention also reduces maintenance, trouble shooting and "risk" cost for routine equipment surveillance activities and/or "hard to get at" equipment. The present invention is also designed to operate in rugged conditions, i.e., in the presence of water and other liquids.

The present invention provides a cost effective means of modifying existing circuitry to allow for equipment surveillance testing as opposed to costly installation and testing of test switches. Should equipment tested result in the need for removal and replacement, the present invention can be physically disconnected to allow for equipment removal. The present invention can serve as a test connection for facilitating on-line connection and disconnection of monitoring/recording equipment without introducing a high risk to system perturbation or tripping. The present invention also allows for infinite circuit configuration arrangements as desired by the test situation.

To attain this, the present invention provides a connecting element which is inserted into a single conductor in an electrical circuit. The element's normal function is to electrically connect or disconnect a single conductor without physical connection/disconnection. The element becomes a permanent part of the circuit. The element has test connections external to the circuit which provide test access to the circuit. The element is placed into connect or disconnect mode by a simple manual manipulation of the element.

Specifically, an electrical circuit disconnect/test connector with male and female plug portions is inserted into a single circuit conductor having a male designated portion and a female designated portion. The male and female plug portions each have a central opening, two ends and an external locking barrel. Each plug portion has a test insert with a hollow, cylindrical test connector element encapsulated therein. A cylindrical male crimp connector is concentrically and snugly positioned within the male plug portion test connector element, said connector having a crimp end portion and a connection end portion, said connection end portion being longitudinally divided into a forward element and a rearward element longitudinally next to said crimp portion, said forward element having an electrically insulating sleeve thereon. A cylindrical female crimp connector concentrically and snugly positioned within the female plug portion test connector element, said connector having a crimp end portion and a connection end portion, said connection end portion being hollow and having an inwardly formed flange at its foremost end, said flange engaging the male crimp connector forward insulated element. Wherein joining said female and male plug external locking barrels moves said female crimp connector inwardly formed flange into engagement with the male crimp connector rearward element.

The present invention is also designed to operate under rugged conditions in the presence of water and other liquids.

These together with other objects of the invention, along with various features of novelty which characterize the invention, are pointed out with particularity in the claims annexed hereto and forming a part of this disclosure. For a better understanding of the invention, its operating advantages and the specific objects attained by its uses, reference should be had to the accompanying drawings and descriptive matter in which there is illustrated a preferred embodiment of the invention.

DETAILED DESCRIPTION OF THE INVENTION

Figure 1:
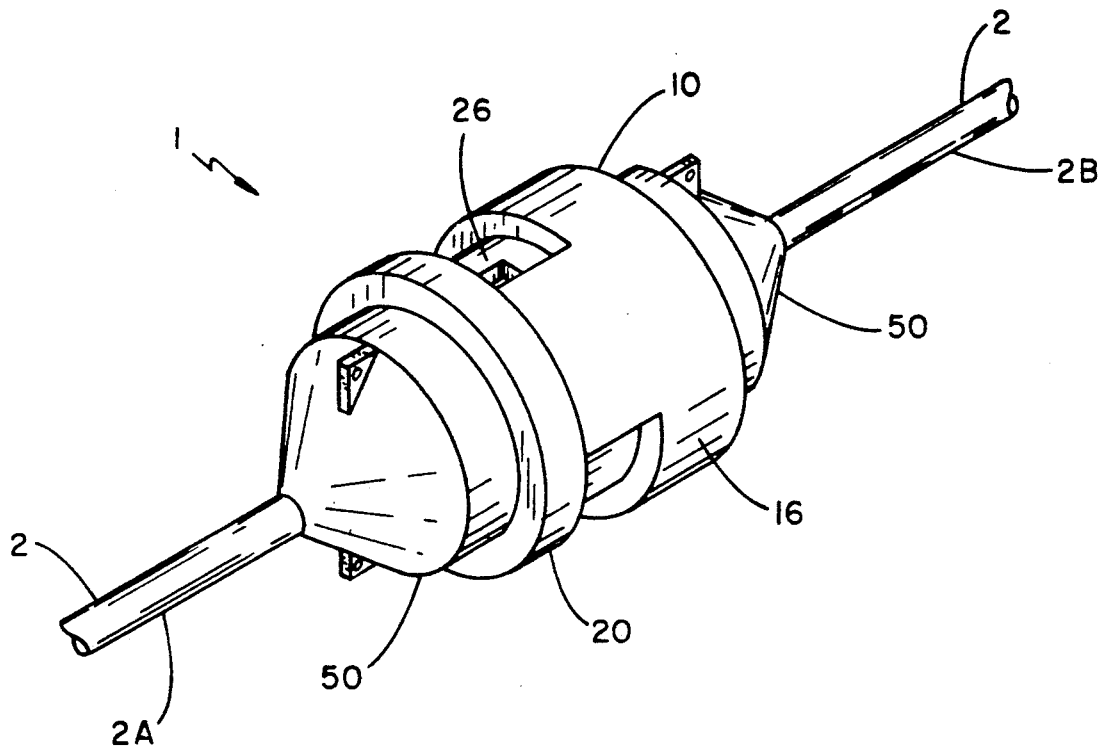
FIG. 1 is a perspective view of a test connector constructed in accordance with the present invention.
Figure 2:
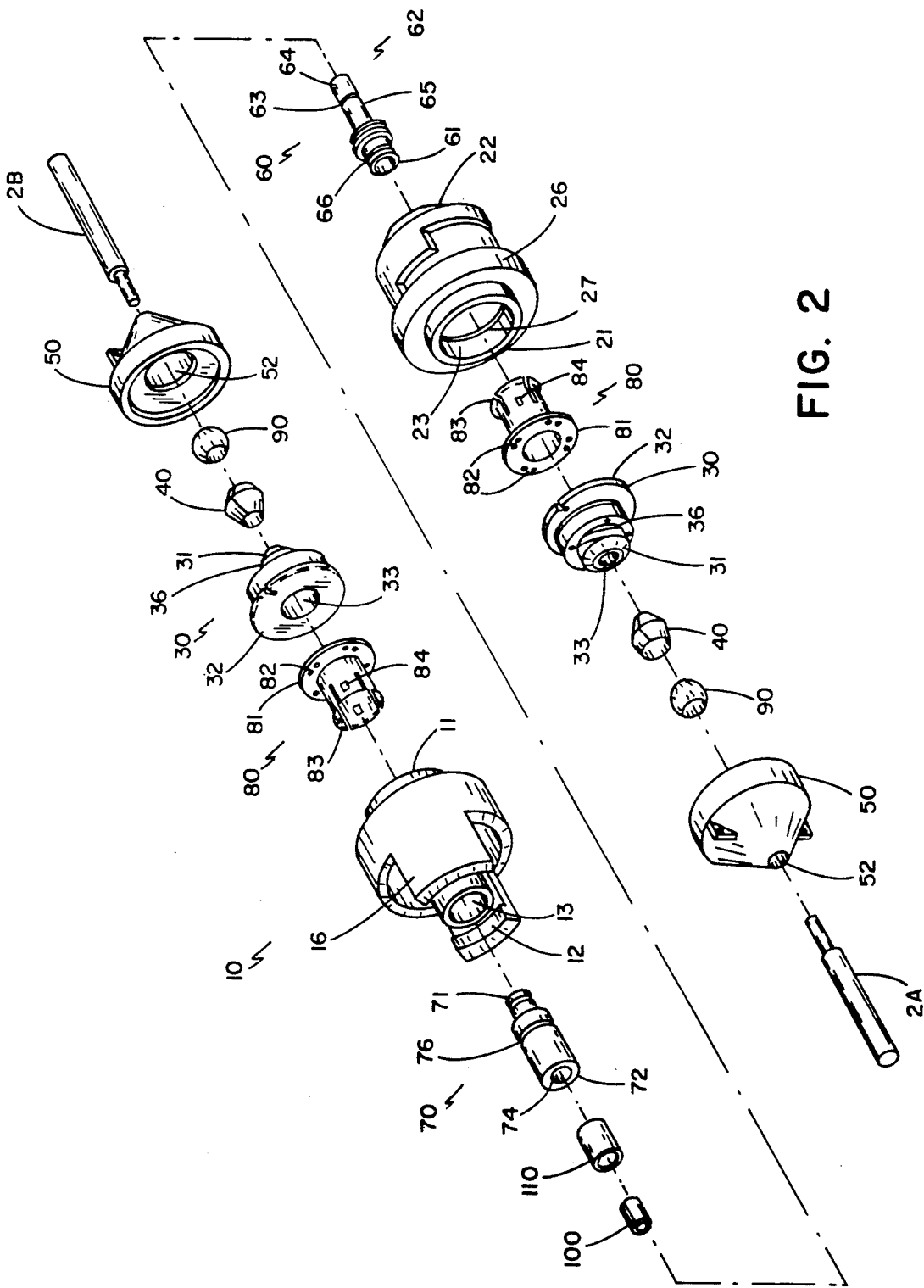
FIG. 2 is an exploded view of FIG. 1.

Referring to the drawings in detail wherein like elements are indicated by like numerals, reference numeral 1 refers to a test connector embodying the features of the present invention. The test connector 1 is inserted into a single circuit conductor 2. The test connector 1 has a female plug portion 10 and a male plug portion 20. Each plug portion 10, 20 is preferably made of an insulating elastomer substance. Alternatively, a plastic material may be used. If a plastic material is used, a concentric, rubbery liner (not shown) is required inside the male plug portion locking barrel 26. A concentric rubbery insert (not shown) would also be required inside the female plug portion locking barrel 16. The liner and insert would cooperatively form a water tight seal between the male plug portion locking barrel 26 and female plug portion locking barrel 16.

The male plug portion 20 has a generally cylindrical shape, a central opening 23, and two ends, one designated the connecting end 22 and the other the nonconnecting end 21. A generally cylindrical test insert 30 having a central opening 33, an external end 31 and an internal end 32 is partially inserted concentrically into the male plug central opening 23 via the male plug's nonconnecting end 21 so that the test insert external end 31 protrudes from the male plug nonconnecting end 21. The test insert's internal end 32 has an external radial notched flange shape. The male plug central opening 23 has an internal radial notched groove 27 formed therein. The insert's flange end 32 fits into the male plug notched groove 27. The notches positively locate the insert 30 within and in relation to the male plug 20.

The test insert central opening 33 contains a radial groove 34. The test insert external end 31 contains two or more longitudinal channels 35 parallel to the central opening 33 and opening into the radial groove 34. A hollow, cylindrical test connector element 80 with an external, radial flange 81 formed at one end is concentrically encapsulated within the test insert central opening 33 so that the test connector radial flange 81 is positioned within the test insert central opening radial groove 34. The test connector radial flange 81 contains up to four sets of holes 82. The test connector element 80 is radially positioned so that the holes 82 are externally accessible via the test insert channels 35 by a j hook test probe (not shown). Other types of test probes may also be used.

Figure 3:
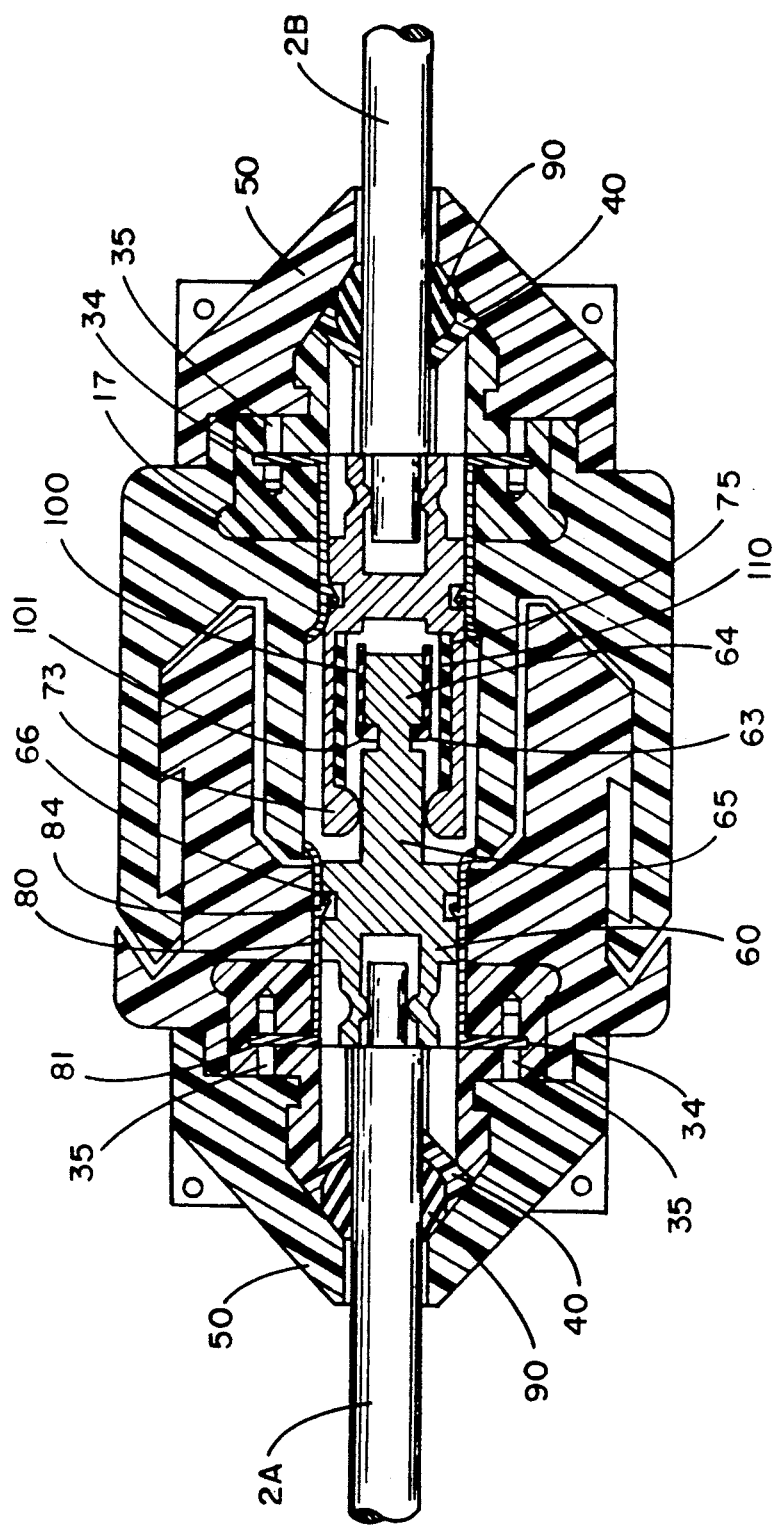
FIG. 3 is a cross sectional view of the connector shown in FIG. 1 along its longitudinal axis, said connector being shown in its normally "closed" electrically conducting position.

Concentrically and snugly positioned within the test connector element 80 is a longitudinal, cylindrical male crimp connector 60. The test connector element 80 and crimp connector 60 are electrically joined. The crimp connector 60 has a crimp end portion 61 and a connection end portion 62. The crimp end 61 is hollow. The male portion 2A of the circuit conductor 2 fits into the hollow crimp end 61 and is crimped to the crimp connector 60. The radial diameter of the crimp end portion 61 of the crimp connector 60 is greater than the radial diameter of the crimp connector connection end portion 62. A radial groove 63 is located at the longitudinal midpoint of the crimp connector connection end portion 62. The radial groove 63 divides the connection end portion into a forward element 64 and rearward element 65. The radial diameter of the forward element 64 is less than the radial diameter of the rearward element 65. An insulating cylindrical sleeve 100 is slid over the crimp connector forward element 64. The sleeve 100 has an inner flange 101 formed at one end. The sleeve 100 is slid over the crimp connector forward element 64, flange end 101 first, until said flange 101 fits into the crimp connector connection end portion radial groove 63. The outer radial diameter of the sleeved forward element 64 is approximately equal to the radial diameter of the rearward element 65. The sleeve 100 could optionally be placed over the rearward element 65 instead of the forward element 64 thereby changing the connector configuration to a normally closed electrically nonconducting configuration rather than a normally closed electrically conducting configuration as shown in FIG. 3. Depending upon the actual material used in making the sleeve 100 it may be necessary to longitudinally slot the sleeve 100 in order to slide it over the forward element 64.

The test connector element 80 is longitudinally slotted toward its non-flange end 83. This permits some flexing as the crimp connector 60 is inserted into the test connector element 80. The test connector element 80 also contains bent in tabs 84 formed near to the non-flange end 83. The crimp connector crimp end portion 61 contains a circumferential groove 66 into which the test connector tabs 84 fit when the test connector element 80 and crimp connector 60 are joined together.

The female plug portion 10 has a generally cylindrical shape, a central opening 13, and two ends, one designated the connecting end 12 and the other the nonconnecting end 11. A generally cylindrical test insert 30, identical to the one used in the male plug portion 20, also having a central opening 33, an external end 31 and an internal end 32 is partially inserted concentrically into the female plug central opening 13 via the female plug's nonconnecting end 11 so that the test insert external end 31 protrudes from the female plug nonconnecting end 11. The test insert's internal end 32 has an external radial notched flange shape. The female plug central opening 13 has an internal radial notched groove 17 formed therein. The insert's flange end 32 fits into the female plug notched groove 17. The notches positively locate the insert 30 within and in relation to the female plug 10.

The test insert central opening 33 contains a radial groove 34. The test insert external end 31 contains two or more longitudinal channels 35 parallel to the central opening 33 and opening into the radial groove 34. A hollow, cylindrical test connector element 80, identical to the one used in the male plug portion 20, with an external, radial flange 81 formed at one end is concentrically fitted within the test insert central opening 33 so that the test connector radial flange 81 is positioned within the test insert central opening radial groove 34. The test connector radial flange 81 contains up to four sets of holes 82. The test connector element 80 is radially positioned so that the holes 82 are externally accessible via the test insert channels 35 by a j-hook test probe (not shown). Other types of test probes may also be used.

Concentrically and snugly positioned within the test connector element 80 is a longitudinal, cylindrical, female crimp connector 70. The test connector element 80 and crimp connector 70 are electrically joined. The crimp connector 70 has a crimp end portion 71 and a connection end portion 72. The crimp end 71 is hollow. The female portion 2B of the circuit conductor 2 fits into the hollow crimp end 71 and is crimped to the crimp connector 70. The external radial diameter of the crimp end portion 71 of the crimp connector 70 is less than the radial diameter of the crimp connector connection end portion 72. The crimp connector connection end portion 72 is hollow and slotted. The connection end portion 72 has an inwardly formed flange 73 at its foremost end 74. A hollow, cylindrical insulator 110 is inserted into the hollow crimp connector connection end portion 72, fitting snugly against the connection end portion inner walls 75.

The test connector element 80 is longitudinally slotted toward its non-flange end 83. This permits some flexing as the crimp connector 70 is inserted into the test connector element 80. The test connector element 80 also contains bent in tabs 84 formed near to the non-flange end 83. The crimp connector crimp end portion 71 contains a circumferential groove 76 into which the test connector tabs 84 fit when the test connector element 80 and crimp connector 70 are joined together.

Figure 4:
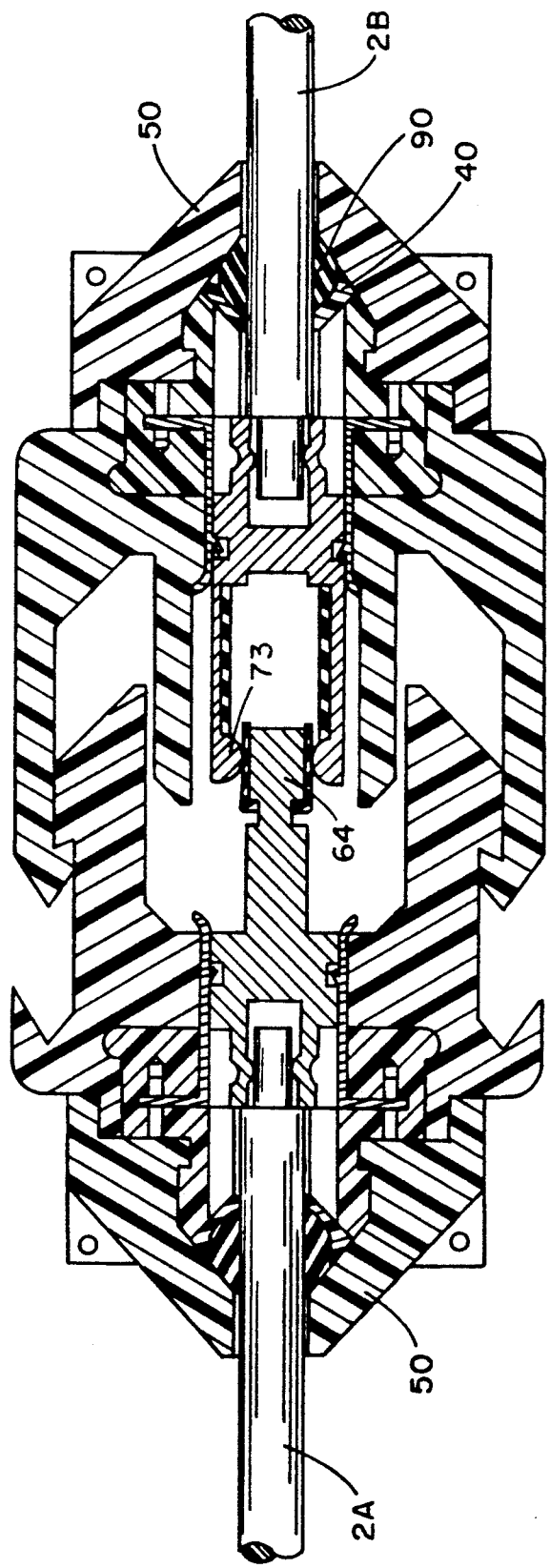
FIG. 4 is a cross sectional view of the connector shown in FIG. 1 along its longitudinal axis, said connector being shown in its "open" electrically nonconducting position.

The female plug portion 10 has an external locking barrel 16 which cooperatively joins onto the male plug portion locking barrel 26 at position "A" or position "B". In position "A" (FIG. 3) the female crimp connector inwardly formed flange 73 engages the male crimp connector rearward element 65 thereby electrically connecting circuit conductor portion 2A with 2B. In position "B" (FIG. 4) the female crimp connector inwardly formed flange 73 engages the male crimp connector forward insulated element 64 thereby electrically disconnecting circuit conductor portion 2A from 2B.

Each of the plug portions 10, 20 has a rigid elastomer split compression ferrule 40 positioned about each connector portion 2A and 2B. The ferrules 40 are slid along their respective connector portions 2A, 2B until seated against and partially into each test insert external end central opening 33. A grommet seal 90 is then positioned about each connector portion 2A and 2B and slid against its respective ferrule 40. This arrangement permits use of varying size grommet seals 90 and therefore provides isolation for varying size wire 2. Each of the plug portions 10, 20 has an isolating elastomer end cap 50 having a half turn, internally threaded, central opening 52. The male plug test insert external end 31 and female plug test insert external end 31 have a corresponding external half turn thread 36 formed thereon. This permits positive engagement and locking of the end caps 50 to the male and female plug portions 20 and 10. The isolating end caps 50 cover the ferrules 40 and grommet seals 90 and in conjunction with the ferrules 40 and grommet seals 90 provide an optional water tight seal to the non connecting ends 11 and 21 of the female and male plugs, respectively.

The end caps 50 normally isolate and prevent access to the test insert channels 35. The test insert channels 35 can be accessed, as desired, by a simple manual manipulation to remove the end cap 50. External test probes may be inserted through the test insert channel 35 to gain access to the test connector element radial flanges 81.

It is at times desirable to have screw terminal connectors in lieu of crimp connectors. In the present embodiment of the invention optional insulated external screw terminal connectors (not shown) can be provided which are electrically connected to the test connector element 80. In this manner a more reliable and permanent connection for test equipment is made available for applications where screw terminal connection is desired or more practical.

It is understood that the above-described embodiment is merely illustrative of the application. Other embodiments may be readily devised by those skilled in the art which will embody the principles of the invention and fall within the spirit and scope thereof. The male plug portion locking barrel 26 may be color coded so that the position of the test element, i.e., FIG. 3 or FIG. 4, may be easily discernible to the naked eye. Connectors other than crimp connectors may also easily be used.

I claim:

1. An electrical circuit disconnect/test connector with male and female plug portions inserted into a single circuit conductor having a male designated portion and a female designated portion, said male and female plug portions each have a central opening, two ends and an external locking barrel, comprising:
   a hollow test insert protruding from each plug portion;
   a hollow, cylindrical test connector element encapsulated therein;
   a cylindrical male connector concentrically and snugly positioned within the male plug portion test connector element, said connector having one end connected to said conductor male designated portion and a connection end portion, said connection end portion being longitudinally divided into a forward element and a rearward element longitudinally next to said connected end, said forward element having an electrically insulating sleeve thereon;
   a cylindrical female connector concentrically and snugly positioned within the female plug portion test connector element, said connector having one end connected to said conductor female designated portion and a connection end portion, said connection end portion being hollow and having an inwardly formed flange at its foremost end, said flange engaging the male connector forward insulated element;
   wherein joining said female and male plug external locking barrels moves said female connector inwardly formed flange into engagement with the male connector rearward element.

2. A test connector as recited in claim 1, further comprising:
   two rigid elastomer split compression ferrules one each positioned about each said single circuit conductor male designated portion and female portion, said ferrules being seated against and partially into each test insert external and central opening.

3. A test connector as recited in claim 2, further comprising:
   two grommet seals one each positioned about each said single circuit conductor male designated portion and female portion, said seals being positioned against each respective ferrule.

4. A test connector as recited in claim 3, further comprising:
   two isolating elastomer end caps each having a central internally threaded opening, one each positioned about each said single circuit conductor male designated portion and female portion and covering each respective said ferrule, male and female plug nonconnecting ends, and grommet seal, one each attached to male and female plug test insert external ends.

5. A test connector as recited in claim 4, wherein:
   said male plug test insert external end and said female plug test insert external end have an external half turn thread formed thereon; and
   said end caps have a corresponding half turn internal radial thread formed within their central openings, whereby positive engagement and locking of the end caps to the male and female plug portions is obtained.

6. A test connector as recited in claim 5, wherein:
   each test insert has a central opening with a radial groove, an external end having an external half turn thread, an internal end, and a plurality of longitudinal channels parallel to the central opening and opening into the radial groove, wherein one of said inserts is inserted into the male plug portion central opening and the other of which is inserted into the female plug portion central opening.

7. A test connector as recited in claim 6, wherein:
said end caps have an internal half turn thread formed therein which engages with a corresponding test insert half turn external thread.

8. A test connector as recited in claim 7, wherein:
each test connector element has two ends, one end of which terminates in an external, radial flange, wherein one of said elements is concentrically fitted within the plug portion test insert central opening so that its radial flange is positioned within the test insert central opening radial groove.

9. A test connector as recited in claim 8, wherein:
an external screw terminal connector is provided for each plug portion, said connector being electrically connected to its respective test connector element.

10. A test connector as recited in claim 9, wherein:
said male plug portion locking barrel is color coded so that the position of the test element is discernible to the naked eye.

11. An electrical circuit disconnect/test connector with male and female plug portions inserted into a single circuit conductor having a male designated portion and a female designated portion, said male and female plug portions each have a central opening, two ends and an external locking barrel, comprising:
a hollow test insert protruding from each plug portion;
a hollow, cylindrical test connector element encapsulated therein;
a cylindrical male connector concentrically and snugly positioned within the male plug portion test connector element, said connector having one end connected to said conductor male designated portion and a connection end portion, said connection end portion being longitudinally divided into a forward element and a rearward element longitudinally next to said connected end, said rearward element having an electrically insulating sleeve thereon;
a cylindrical female connector concentrically and snugly positioned within the female plug portion test connector element, said connector having one end connected to said conductor female designated portion and a connection end portion, said connection end portion being hollow and having an inwardly formed flange at its foremost end, said flange engaging the male connector forward element;
wherein joining said female and male plug external locking barrels moves said female connector inwardly formed flange into engagement with the male connector rearward insulated element.

12. A test connector as recited in claim 11, further comprising:
two rigid elastomer split compression ferrules one each positioned about each said single circuit conductor male designated portion and female portion, said ferrules being seated against and partially into each test insert external and central opening.

13. A test connector as recited in claim 12, further comprising:
two grommet seals one each positioned about each said single circuit conductor male designated portion and female portion, said seals being positioned against each respective ferrule.

14. A test connector as recited in claim 13, further comprising:
two isolating elastomer end caps each having a central internally threaded opening, one each positioned about each said single circuit conductor male designated portion and female portion and covering each respective said ferrule, male and female plug nonconnecting ends, and grommet seal, one each attached to male and female plug test insert external ends.

15. A test connector as recited in claim 14, wherein:
said male plug test insert external end and said female plug test insert external end have an external half turn thread formed thereon; and
said end caps have a corresponding half turn internal radial thread formed within their central openings, whereby positive engagement and locking of the end caps to the male and female plug portions is obtained.

16. A test connector as recited in claim 15, wherein:
each test insert has a central opening with a radial groove, an external end having an external half turn thread, an internal end, and a plurality of longitudinal channels parallel to the central opening and opening into the radial groove, wherein one of said inserts is inserted into the male plug portion central opening and the other of which is inserted into the female plug portion central opening.

17. A test connector as recited in claim 16, wherein:
said end caps have an internal half turn thread formed therein which engages with a corresponding test insert half turn external thread.

18. A test connector as recited in claim 17, wherein:
each test connector element has two ends, one end of which terminates in an external, radial flange, wherein one of said elements is concentrically fitted within the plug portion test insert central opening so that its radial flange is positioned within the test insert central opening radial groove.

19. A test connector as recited in claim 18, wherein:
an external screw terminal connector is provided for each plug portion, said connector being electrically connected to its respective test connector element.

20. A test connector as recited in claim 19, wherein:
said male plug portion locking barrel is color coded so that the position of the test element is discernible to the naked eye.

* * * * *